(12) United States Patent
Kimoto et al.

(10) Patent No.: US 8,665,919 B2
(45) Date of Patent: Mar. 4, 2014

(54) SEMICONDUCTOR LASER MODULE

(75) Inventors: Tatsuya Kimoto, Tokyo (JP); Kazuaki Kiyota, Tokyo (JP)

(73) Assignee: Furukawa Electric Co., Ltd., Tokyo (JP)

(*) Notice: Subject to any disclaimer, the term of this patent is extended or adjusted under 35 U.S.C. 154(b) by 52 days.

(21) Appl. No.: 13/203,529

(22) PCT Filed: Mar. 17, 2010

(86) PCT No.: PCT/JP2010/054601
§ 371 (c)(1),
(2), (4) Date: Aug. 26, 2011

(87) PCT Pub. No.: WO2010/110152
PCT Pub. Date: Sep. 30, 2010

(65) Prior Publication Data
US 2011/0310916 A1 Dec. 22, 2011

(30) Foreign Application Priority Data

Mar. 26, 2009 (JP) .................. 2009-077444

(51) Int. Cl.
*H01S 5/06* (2006.01)
*H01S 5/0687* (2006.01)

(52) U.S. Cl.
USPC .................. 372/32; 372/20; 372/29.016

(58) Field of Classification Search
USPC ................................ 372/20, 32, 29.016
See application file for complete search history.

(56) References Cited

U.S. PATENT DOCUMENTS

| 2002/0018507 A1* | 2/2002 | Deacon ................. 372/96 |
| 2003/0012501 A1 | 1/2003 | Nakajima et al. |
| 2004/0136415 A1* | 7/2004 | Park et al. ............ 372/20 |

FOREIGN PATENT DOCUMENTS

| JP | 2003-014963 A | | 1/2003 |
| JP | 2003-078209 A | | 3/2003 |
| JP | 200375666 A | | 3/2003 |
| JP | 2004-055647 A | | 2/2004 |
| JP | 2006-216695 A | | 8/2006 |
| JP | 2007142110 | * | 7/2007 |
| JP | 2007-250889 A | | 9/2007 |
| JP | 2007250889 | * | 9/2007 |
| JP | 2008-145734 A | | 6/2008 |
| JP | 2008-205113 A | | 9/2008 |
| JP | 2008205113 | * | 9/2008 |

OTHER PUBLICATIONS

International Search Report for PCT/JP2010/054601 mailed Apr. 20, 2010.
Office Action mailed Sep. 10, 2013, corresponds to Japanese patent application No. 2011-506001.

* cited by examiner

*Primary Examiner* — Jessica Stultz
*Assistant Examiner* — Michael Carter
(74) *Attorney, Agent, or Firm* — Lowe Hauptman & Ham, LLP

(57) ABSTRACT

A semiconductor laser module includes a semiconductor device including a semiconductor laser and a bending waveguide through which a laser light emitted from the semiconductor laser propagates, a beam splitter splitting the laser light into a first laser light and a second laser light, a plurality of detectors respectively arranged at different positions in a cross section of a light flux of the second laser light to detect the second laser light, and a waveform shaping unit provided on an optical path of the laser light. The waveform shaping unit is configured to make a relation between an output of the semiconductor laser and detection values of the detectors approach a linear relation.

8 Claims, 8 Drawing Sheets

SEMICONDUCTOR LASER MODULE

CROSS-REFERENCE TO RELATED APPLICATION

This application is a National Stage of International Application No. PCT/JP2010/054601 filed on Mar. 17, 2010, which is based upon and claims the benefit of priority from Japanese Patent Application No. 2009-077444, filed on Mar. 26, 2009.

FIELD

The present invention relates to a semiconductor laser module in which a laser light output from a semiconductor laser element is emitted with an inclination relative to an output facet using a bending waveguide so that reflected light can be reduced.

BACKGROUND

In order to reduce a back-reflected light from an output facet when a laser light is output from a semiconductor laser element, a bending waveguide is widely used, which bends at about 7 degrees with respect to the output facet, for example. With the help of the bending waveguide, the back-reflected light returning to a resonator of the semiconductor laser element is reduced, so that a stable laser light can be output.

On the other hand, in a conventional semiconductor laser module in which light output from a semiconductor laser module is guided to an optical fiber to output the light through the optical fiber, a part of the output laser light is branched by a beam splitter or the like, and wavelength locking control is performed using an optical power monitor and a wavelength monitor that monitors the optical power of a predetermined wavelength. In this case, when the beam splitter is provided to each of the optical power monitor and the wavelength monitor, the number of optical components increases, which impedes downsizing of the semiconductor laser module. Therefore, a technique is disclosed in which an optical power monitor and a wavelength monitor are disposed in parallel on the light flux of the light branched by the beam splitter, and the branched light are divided in the optical axis direction to be respectively received by the optical power monitor and the wavelength monitor (see Patent Document 1).

CITATION LIST

Patent Document

Patent Document 1: Japanese Patent Application Laid-Open No. 2006-216695

SUMMARY

Technical Problem

However, when the bending waveguide is used, leakage light from the bending waveguide as well as guided light output in the guiding direction of an output facet is present in the laser light output from the output facet. Due to the presence of the leakage light, a far-field pattern (FFP), which is a distribution pattern of the laser light output from the output facet, is asymmetrical with respect to the center of the optical axis because a side lobe appears on the leakage light side.

If the monitoring of the optical power of light output from a semiconductor device having the bending waveguide is performed with a power monitor and a wavelength monitor using the light branched by a single beam splitter, the detected optical output power differs between the power monitor and the wavelength monitor due to the asymmetry of the FFP. Therefore, there is a problem in that it is difficult to perform the wavelength locking control with a high degree of accuracy. In particular, since the FFP changes with a change in the optical power of the laser light, and the magnitude of the difference also changes, there is a problem in that it is difficult to perform wavelength locking control with a high degree of accuracy.

The present invention has been made in view of the above aspects, and an object of the invention is to provide a semiconductor laser module capable of performing the wavelength locking control in a stable manner with a high degree of accuracy even when monitoring the optical power and the wavelength of light, respectively using lights obtained by dividing a light output from a semiconductor device having a bending waveguide in the optical axis direction.

Solution to Problem

According to one aspect of the present invention, there is provided a semiconductor laser module including a semiconductor device that includes a semiconductor laser that emits a laser light and a bending waveguide through which the laser light emitted from the semiconductor laser propagates, a beam splitter to which the laser light propagated through the bending waveguide is input, which splits the laser light into a first laser light and a second laser light, a plurality of detectors respectively arranged at different positions in a cross section of a light flux of the second laser light to detect the second laser light, and a waveform shaping unit provided on an optical path of the laser light. The waveform shaping unit being configured to make a relation between an output of the semiconductor laser and detection values of the detectors approach a linear relation According another aspect of the present invention, the waveform shaping unit shapes a far field pattern of the laser light at an output port of the semiconductor device to be approximately symmetrical with respect to an optical axis of the laser light.

According another aspect of the present invention, the waveform shaping unit is the bending waveguide with a bending radius R satisfying $$R \geq A \times \Delta n^{(-B)},$$

where $\Delta n$ is equivalent refractive index difference between a waveguide portion and a cladding portion of the bending waveguide defined as {(refractive index of the waveguide portion)−(refractive index of the cladding portion)}/(refractive index of the waveguide portion), and A and B are constants with A=0.62 and B=1.59.

According to still another aspect of the present invention, the bending radius R is equal to or larger than 1000 micrometers.

According to still another aspect of the present invention, an optical output loss due to the bending waveguide is equal to or smaller than 2%.

According to still another aspect of the present invention, the semiconductor laser is a selective-type wavelength-tunable laser including a plurality of semiconductor laser elements. The laser light is a wavelength-tunable laser light output from a selected semiconductor laser element selected from the semiconductor lasers. The semiconductor device further includes an optical coupler that outputs the wavelength-tunable laser light to the bending waveguide. The waveform shaping unit includes a leakage-light blocking portion that blocks a leakage light from the optical coupler.

According to still another aspect of the present invention, the semiconductor device further includes a semiconductor optical amplifier that amplifies the laser light emitted from the semiconductor laser. The bending waveguide is arranged at a stage prior to an optical input stage of the semiconductor optical amplifier.

According to still another aspect of the present invention, the detectors include an output detector that detects optical intensity of the laser light output from the semiconductor device and a wavelength detector that detects optical intensity of a light component in a predetermined wavelength region of the laser light output from the semiconductor device.

According to still another aspect of the present invention, the waveform shaping unit is the bending waveguide. A bent portion of the bending waveguide is set at a position in a distance of 5% to 30% of a waveguide including the bending waveguide from an input port of the waveguide.

According to the present invention, the waveform shaping unit is configured to shape the optical output distribution pattern within a plane vertical to the optical axis of the laser light into an optical output distribution pattern which does not depend on the power of the laser light, by the bending radius of the bending waveguide being 1000 μm or more or the like. Therefore, it is possible to stably perform wavelength locking control with a high degree of accuracy even in the case of detecting lights which are output from a semiconductor device having a bending waveguide and are present at different positions on the light flux.

DESCRIPTION OF EMBODIMENTS

Exemplary embodiments of a semiconductor laser module according to the present invention are described in detail below with reference to accompanying drawings. The present invention is not limited to these embodiments.

First Embodiment

Figure 1:
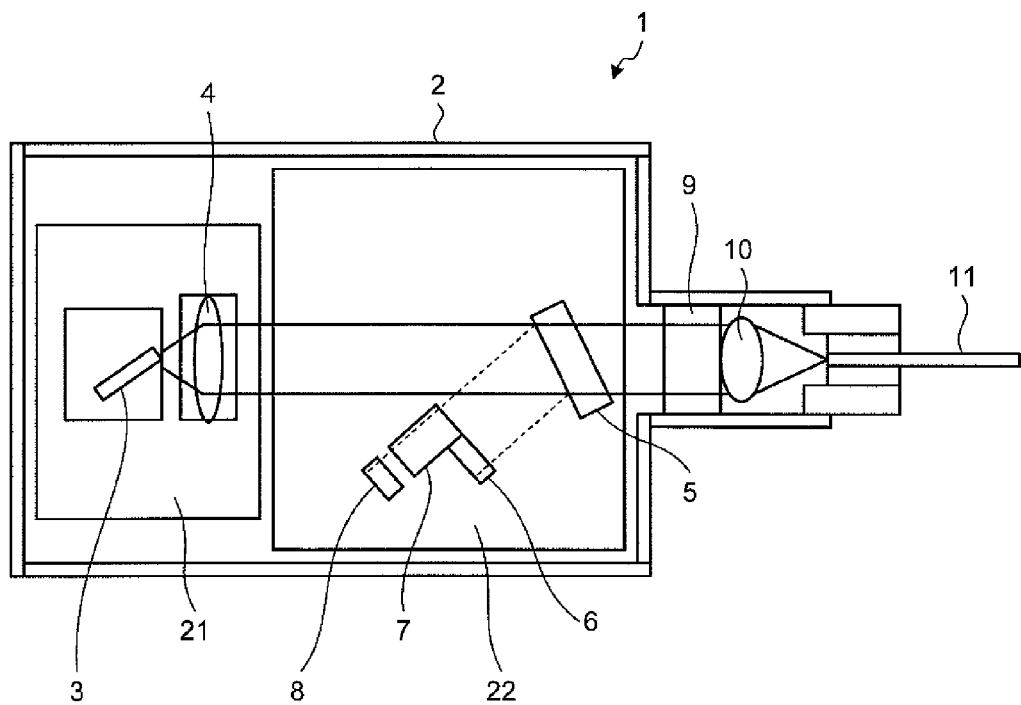
FIG. 1 is a schematic cross-sectional view of a semiconductor laser module according to a first embodiment of the present invention viewed from the top.

FIG. 1 is a schematic cross-sectional view of a semiconductor laser module according to a first embodiment of the present invention viewed from the top. The semiconductor laser module 1 includes a housing 2 and a semiconductor device 3 that is housed in the housing 2 and outputs a laser light. The laser light output from the semiconductor device 3 is converted into a collimated light by a collimating lens 4 provided near an output facet of the laser light. The collimated light is, for example, 4% reflected and 96% transmitted at a beam splitter 5.

The light reflected at the beam splitter 5 is incident on a power monitor PD 6 where the optical output is detected and on a wavelength monitor PD 8 where the optical output in a wavelength region selected by an etalon 7 is detected. The optical outputs detected by the power monitor PD 6 and the wavelength monitor PD 8 are used in a wavelength locking control.

On the other hand, the light transmitted the beam splitter 5 is coupled to an optical fiber 11 that is a single-mode fiber via an optical isolator 9 and a focusing lens 10 and output. The semiconductor device 3 is disposed on a Peltier element 21 that is a temperature control element, so that the oscillation wavelength of the laser light is controlled by a temperature control of the Peltier element 21. The etalon 7 is disposed on a Peltier element 22 that is a temperature control element, so that the selection wavelength is controlled by a temperature control of the Peltier element 22.

Figure 2:
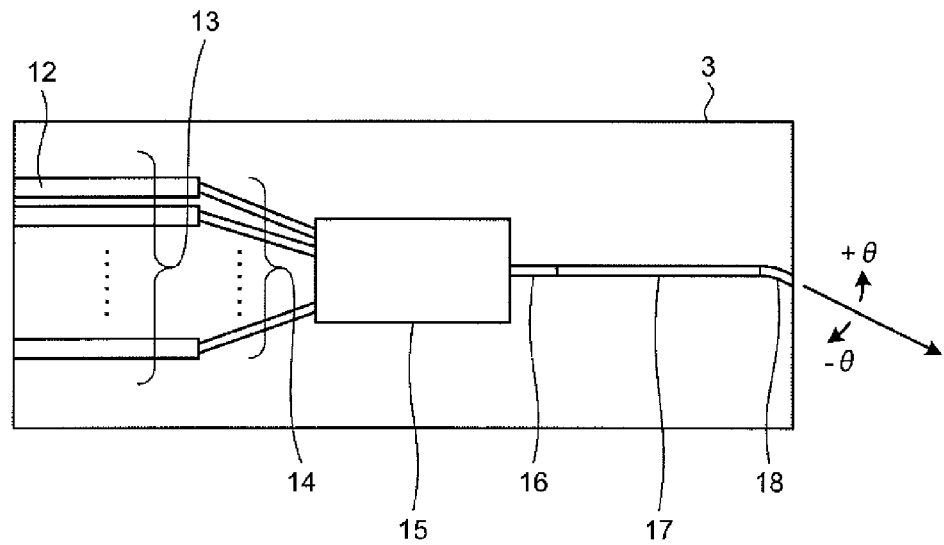
FIG. 2 is a schematic diagram showing a configuration of the semiconductor device shown in FIG. 1.

The semiconductor device 3 is a wavelength-selective-type wavelength-tunable laser shown in FIG. 2, including a plurality of semiconductor lasers 12 arranged in an array. Each of the semiconductor lasers 12 is designed to have a capability of wavelength tuning by an amount of about 3 nm to 4 nm, and the oscillation wavelengths of the semiconductor lasers 12 are arranged at wavelength intervals of about 3 nm to 4 nm. By switching the semiconductor lasers 12 to be driven and controlling the element temperature, it is possible to cover a continuous wavelength band broader than that covered by a single semiconductor laser. In order to cover the wavelength band of WDM optical communication, for example, the entirety of the C-band (1.53 μm to 1.56 μm) or the L-band (1.57 μm to 1.61 μm), by integrating 10 or more of the semiconductor lasers 12 (3 nm to 4 nm wavelength tunable), for example, it is possible to tune the wavelength over a wavelength range of 30 nm or more.

The laser light selected and output from a semiconductor laser array 13 including the semiconductor lasers 12 is input to an optical coupler 15 through a corresponding one of a plurality of waveguides 14 and output to a waveguide 16. The light guided through the waveguide 16 is amplified by a semiconductor optical amplifier (SOA) 17, and is then output through a bending waveguide 18, with an inclination angle of about 7 degrees with respect to the output facet. The inclination angle is preferably in a range of 6 degrees to 12 degrees. With this configuration, it is possible to reduce a back-reflection light returning toward the semiconductor laser array 13.

The bending waveguide 18 is formed with a bending radius R of 1000 μm or more to serve as a waveform shaping unit. An equivalent refractive index difference Δn between a waveguide portion and a cladding portion of the bending waveguide 18 (where Δn={(refractive index of waveguide portion)−(refractive index of cladding portion)}/(refractive index of waveguide portion)) is 1.06.

Figure 3:
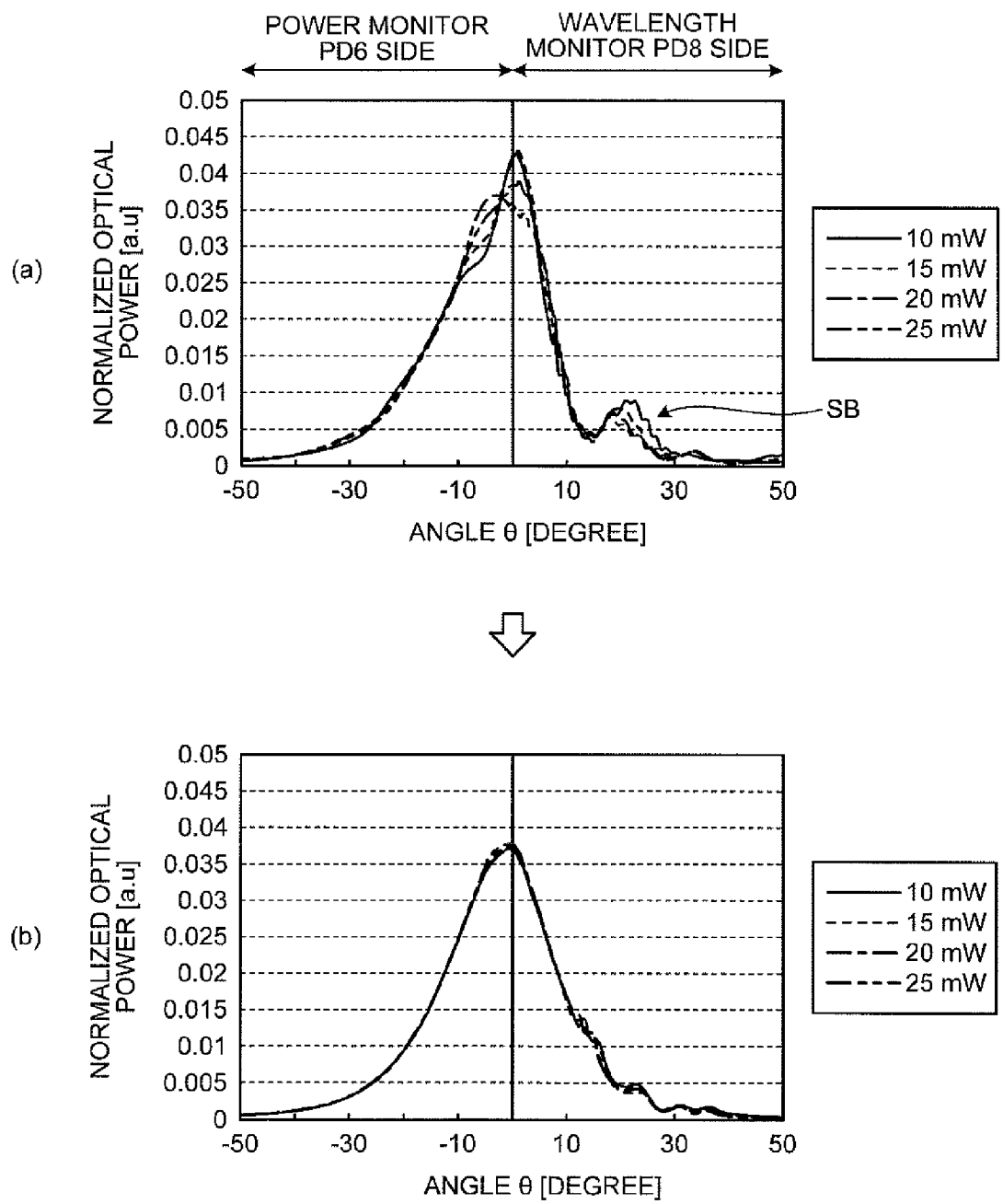
FIG. 3 shows an FFP of a related art and an FFP in which a bending radius is 1000 μm or more.

In FIG. 3, (a) shows an FFP of a laser light output from the output facet when the optical output is changed in a semiconductor device of a related art in which the bending radius is 1000 μm or less, and (b) shows an FFP of a laser light output from the output facet when the optical output is changed in the semiconductor device 3 according to the first embodiment of the present invention in which the bending radius is 1000 μm or more. The positive and negative signs of an angle θ shown in FIG. 3 are set with respect to the optical axis of the laser light shown in FIG. 2 as 0 degrees.

The FFP of the related art shown in (a) of FIG. 3 includes a side lobe SS on the wavelength monitor PD 8 side, and the FFP changes when the optical output is changed to 10 mW, 15 mW, 20 mW, and 25 mW. In particular, the change is noticeable near the angle of 0 degrees and near the side lobe SB. In contrast, when the bending radius is set to 1000 μm or more, as shown in (b) of FIG. 3, the FFP rarely changes even when the optical output is changed, and a stable FFP is obtained. In addition, the FFP has a Gaussian distribution that is substantially symmetrical with respect to the angle of 0 degrees.

Figure 4:
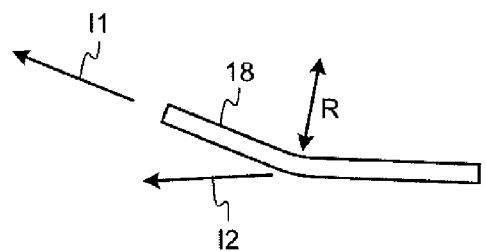
FIG. 4 is a schematic diagram showing guided light and leakage light output from a bending waveguide.

This is considered to be attributable to the following fact. As shown in FIG. 4, if the bending radius R of the bending waveguide 18 is less than 1000 μm, a leakage light I2 is generated due to the guided light going straight, and the side lobe SB is generated by the leakage light I2. Furthermore, the amount of the leakage light I2 changes when the output is changed. In contrast, in the first embodiment, since the bending radius R of the bending waveguide 18 is set to 1000 μm or more, it is possible to suppress the generation of the leakage light I2 and to allow the entire light to be output as guided light I1 which is light directed in the guiding direction at the output facet.

Figure 5:
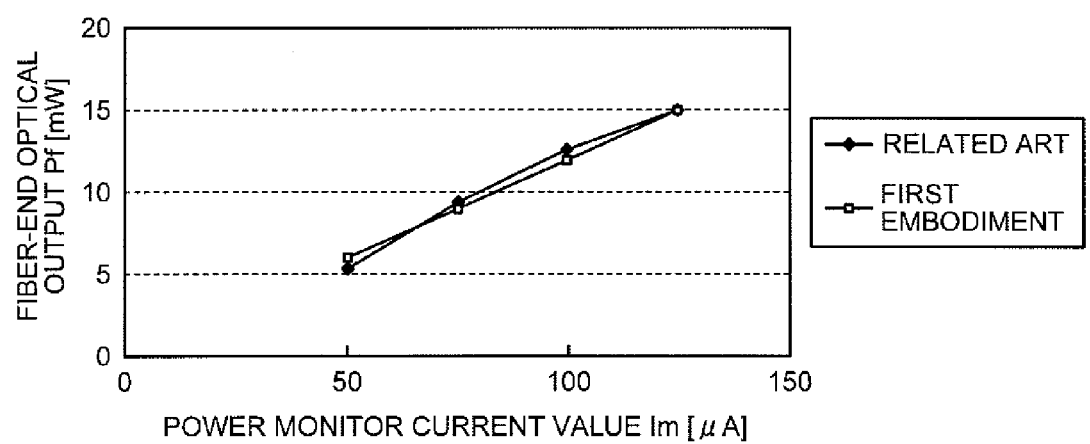
FIG. 5 is a graph showing a dependence of a fiber-end optical output on a power monitor current value according to the related art and the first embodiment.

When the FFP changed with the change in the optical output as shown in (a) of FIG. 3, the leakage light I2 becomes a loss, and the efficiency of optical coupling to the optical fiber 11 changes. As a result, as shown in FIG. 5, the fiber-end optical output Pf (mW) is not relatively proportional to the power monitor current value Im (μA) detected by the power monitor PD 6. On the other hand, in the first embodiment, since the leakage light I2 is suppressed, and the FFP does not change with the optical output as shown in (b) of FIG. 3, the efficiency of optical coupling to the optical fiber 11 is constant. As a result, as shown in FIG. 5, the fiber-end optical output Pf (and the optical output of the selected semiconductor laser 12) and the power monitor current value Im have a substantially proportional relation with each other. Moreover, in the first embodiment, since the FFP barely changes with the optical output, the fiber-end optical output Pf (and the optical output of the selected semiconductor laser 12) and the wavelength monitor current Iwm that is the output of the wavelength monitor PD 8 are also approximately proportional to each other.

The wavelength locking control based on the monitoring results by the power monitor PD 6 and the wavelength monitor PD 8 will be described. The wavelength locking control is performed as follows. First, a desired fiber-end optical output Pf, the wavelength monitor current Iwm at an oscillation wavelength λ, and a ratio Iwm/Im of the wavelength monitor current Iwm to the power monitor current value are measured in advance. The driving current Isoa of the semiconductor optical amplifier 17 is controlled to obtain target values of the fiber-end optical output Pf and the ratio Iwm/Im, and the temperature of the semiconductor device 3 is controlled with the Peltier element 21. That is, by controlling the ratio Iwm/Im to be constant, the wavelength locking control is realized.

Figure 6:
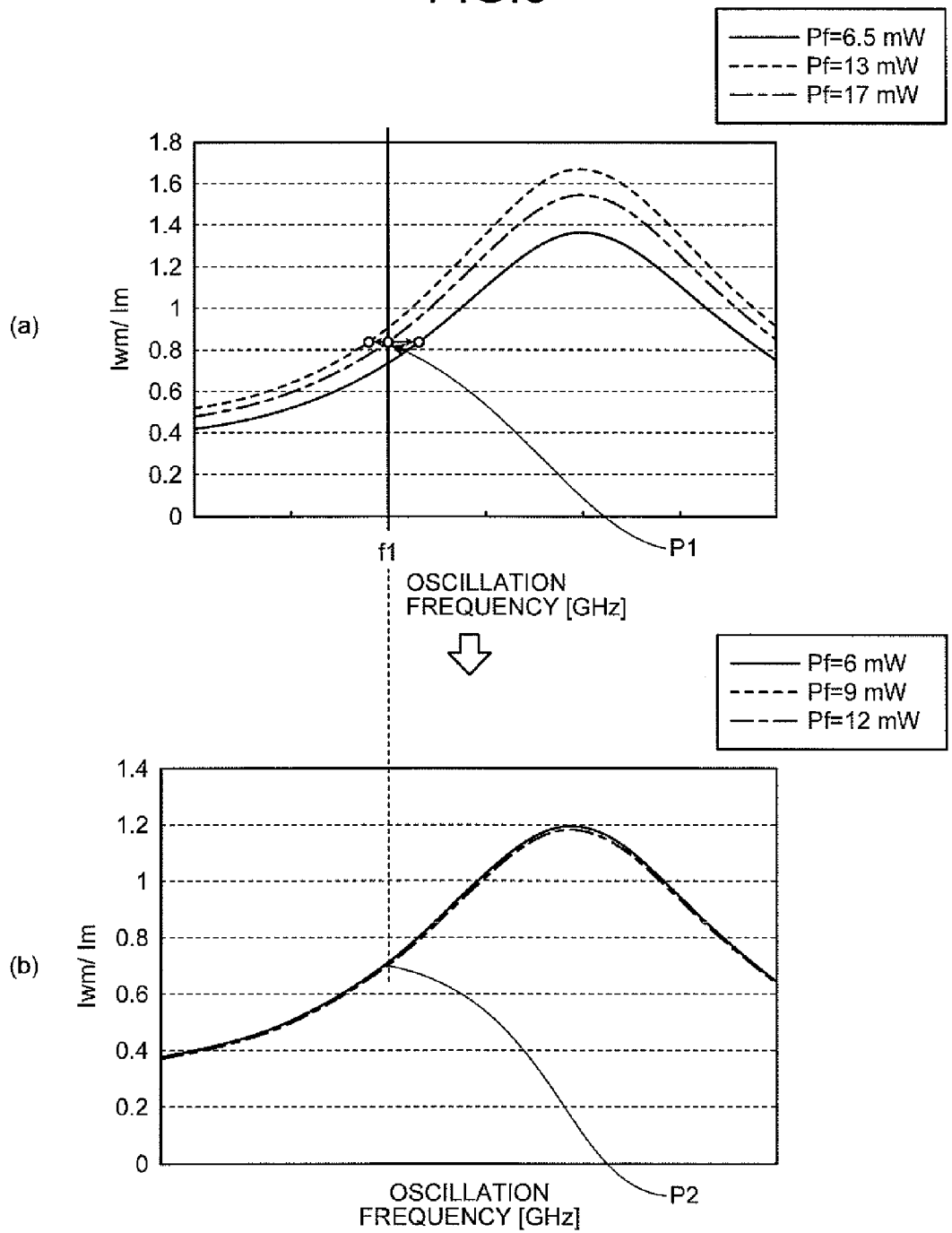
FIG. 6 shows a dependence of a wavelength monitor current value/a power monitor current value on an oscillation frequency according to the related art and the first embodiment.

Since the semiconductor laser module of the related art, as shown in FIG. 5, has characteristics such that the fiber-end optical output Pf is not proportional to the power monitor current value Im and the wavelength monitor current Iwm, the ratio Iwm/Im will change as shown in (a) of FIG. 6, if the wavelength locking control is performed using these characteristics. For example, in FIG. 6, when the optical output is changed (controlled) to Pf=6.5 mW or Pf=13 mW using the same ratio Iwm/Im as that when the fiber-end optical output Pf=17 mW as a target value P1, the oscillation frequency (oscillation wavelength) is shifted. Thus, it is not possible to maintain the wavelength locking control.

On the other hand, in the first embodiment, since the semiconductor laser module has characteristics such that the fiber-end optical output Pf is proportional to the power monitor current value Im and the wavelength monitor current Iwm (linearity), the ratio Iwm/Im does not change even when the optical power is changed. Moreover, as shown in FIG. 5, it is possible to use the same target value P2 regardless of a change in the optical power, and the oscillation frequency (oscillation wavelength) is not shifted. Thus, it is possible to perform the wavelength locking control with a high degree of accuracy.

Figure 7:
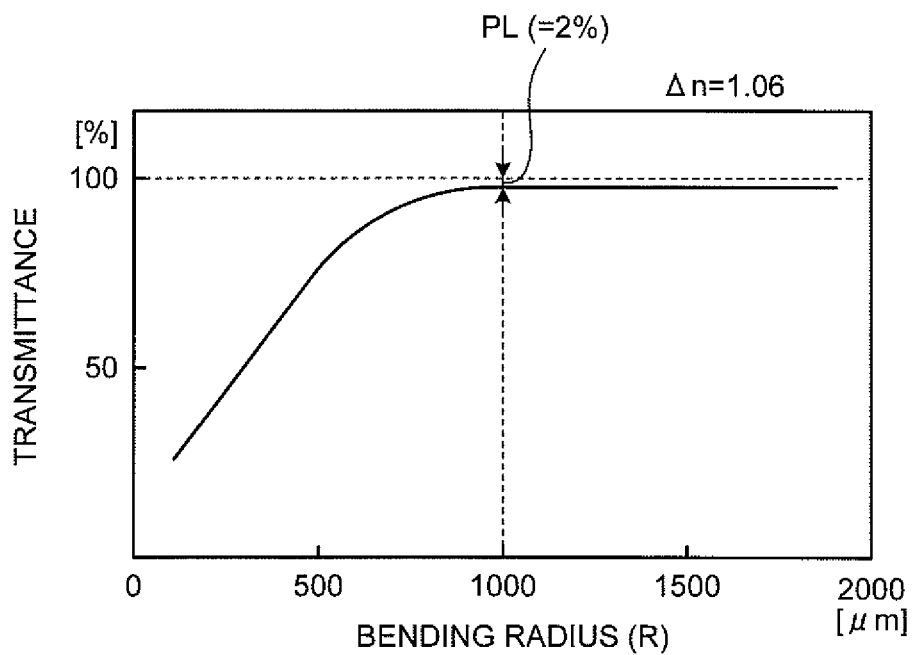
FIG. 7 is a graph showing a dependence of transmittance on a bending radius.

In the first embodiment described above, the bending radius R is set to 1000 μm or more when the equivalent refractive index difference Δn of the bending waveguide 18 is 1.06. This is because, as shown in FIG. 7, if the bending radius R is 1000 μm or more, the transmittance is 98% or more, and an optical power loss PL that is assumed to result from the leakage light is 2% or less. If the optical power loss PL is maintained to be 2% or less, the FFP barely changes even when the optical output is changed.

Figure 8:
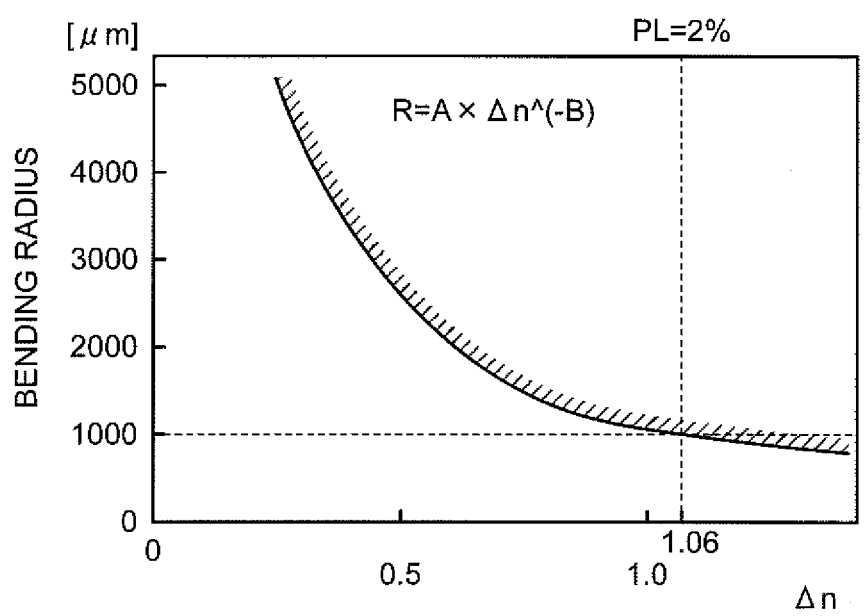
FIG. 8 is a graph showing a dependence of a bending radius on an equivalent refractive index difference.

The relation between the bending radius R and the equivalent refractive index difference Δn when the optical power loss PL is 2% is shown in FIG. 8. The curve shown in the figure can be expressed by $$R = A \times \Delta n^{\wedge}(-B)$$

(where A=0.62, B=1.59), where "^" is a symbol representing exponential. Therefore, when a waveguide having a given equivalent refractive index difference Δn is used, by designing the bending waveguide 18 to have a bending radius equal to or greater than the bending radius R calculated by the above-mentioned expression, it is possible to perform the optical output control and the wavelength locking control with a high degree of accuracy while ensuring that the FFP barely changes with a change in the optical output.

Second Embodiment

Figure 9:
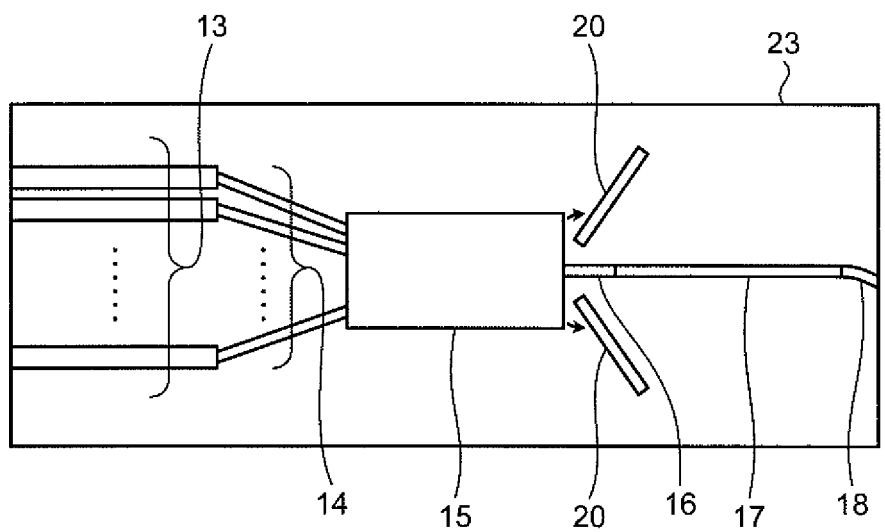
FIG. 9 is a schematic diagram showing a configuration of a semiconductor device according to a second embodiment of the present invention.

In a semiconductor device 23 according to a second embodiment of the present invention, as shown in FIG. 9, a leakage-light blocking portion 20 that blocks a leakage light from the optical coupler 15 or the like, which serves as a waveform shaping unit, is provided halfway between the optical coupler 15 and the bending waveguide 18 of the first embodiment described above. With this configuration, since the leakage light from the optical coupler 15 does not affect the FFP, it is possible to obtain a stable FFP. In particular, the leakage light from the optical coupler 15 may contain higher-order mode components, however, with the above configuration, it is possible to prevent fluctuation of the FFP due to the higher-order mode components. The leakage-light blocking portion 20 may be configured to block the light spatially or may be formed of a member that actively absorbs light.

Third Embodiment

Figure 10:
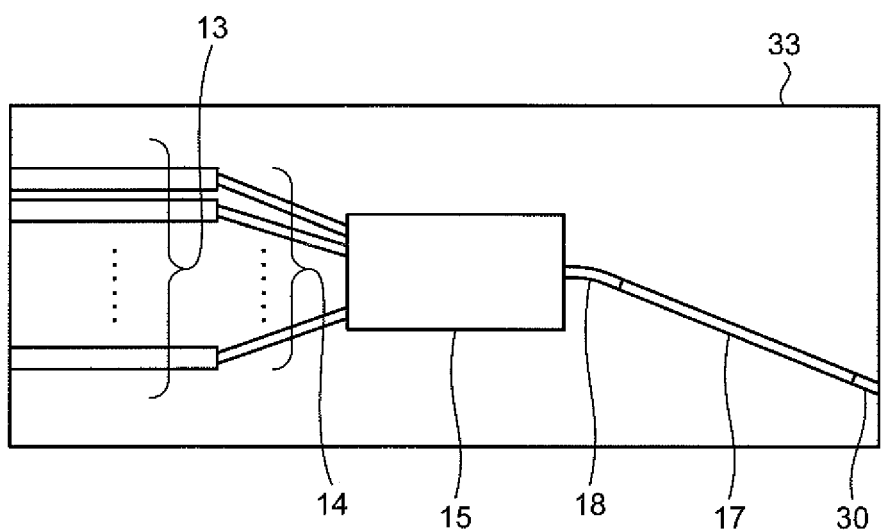
FIG. 10 is a schematic diagram showing a configuration of a semiconductor device according to a third embodiment of the present invention.

In a semiconductor device 33 according to a third embodiment of the present invention, as shown in FIG. 10, the bending waveguide 18 is not arranged at the last-stage waveguide, but is provided between the optical coupler 15 and the semiconductor optical amplifier 17. Since a waveguide 30 at the backward stage of the semiconductor optical amplifier 17 is formed to be oblique to the output facet, it is possible to suppress a back-reflection light.

Fourth Embodiment

Figure 11:
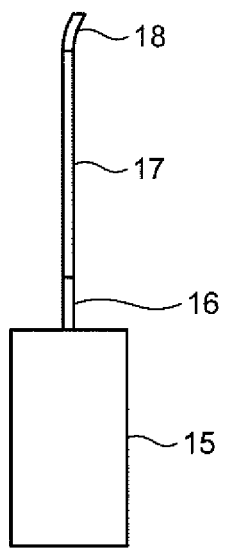
FIG. 11 is a schematic diagram showing a configuration of a semiconductor device in which a bending waveguide is provided near an output port.
Figure 12:
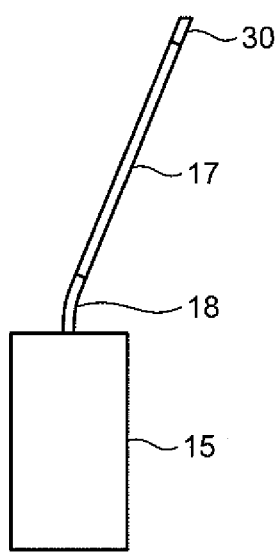
FIG. 12 is a schematic diagram showing a configuration of a semiconductor device in which a bending waveguide is provided near an input port.
Figure 13:
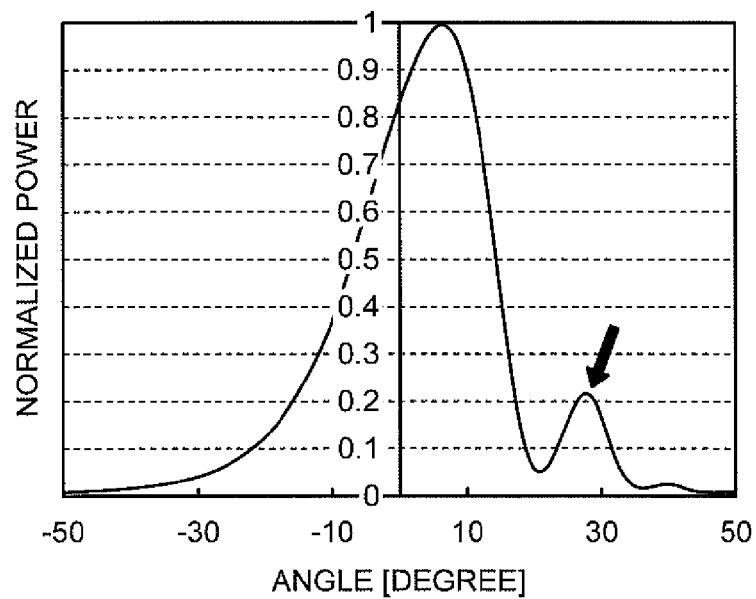
FIG. 13 is a diagram showing an FFP of optical output of a fiber-end by the semiconductor device shown in FIG. 11.
Figure 14:
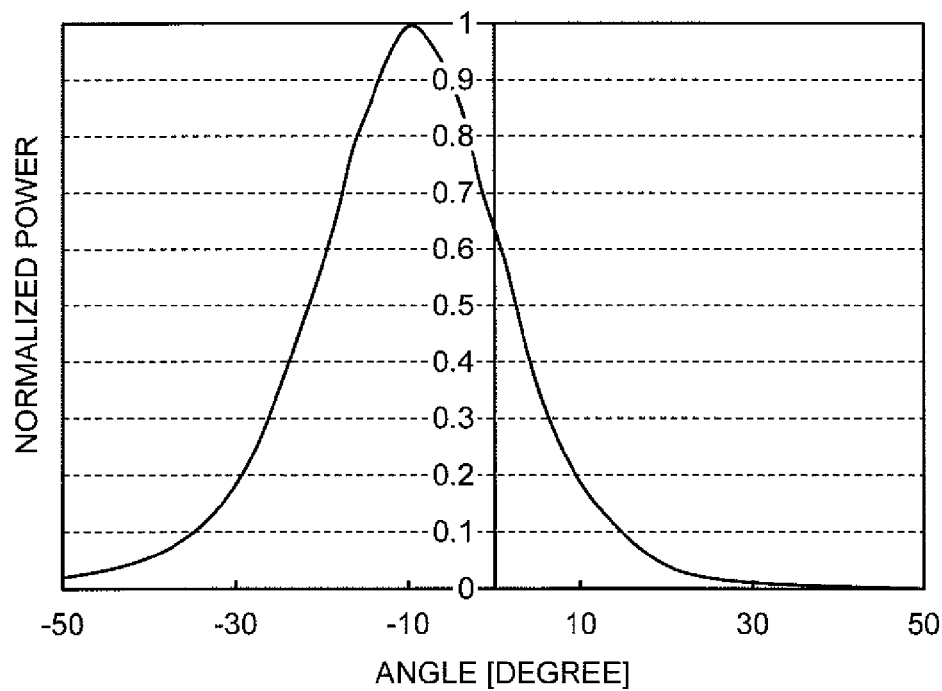
FIG. 14 is a diagram showing an FFP of optical output of a fiber-end by the semiconductor device shown in FIG. 12.

In a fourth embodiment of the present invention, the bent portion of the bending waveguide 18, which is bent at the angle of 7 degrees, is not arranged near the output port as shown FIG. 11, but is provided near the input port for the laser light of an output-side waveguide that includes the bending waveguide 18, the semiconductor optical amplifier 17, and the waveguide 30 as shown in FIG. 12. FIG. 13 shows the FFP of the fiber-end optical output of the configuration shown in FIG. 11. FIG. 11 shows the FFP of the fiber-end optical output of the configuration shown in FIG. 12. In FIGS. 13 and 14, the bending radius R of the bending waveguide 18 is set to 1000 μm or less. According to the related-art structure, a region in which the curve changes nonlinearly like a bump indicated by an arrow is created on a skirt of the distribution profile. However, according to the structure of the present invention, it is possible to obtain an ideal distribution profile as shown in FIG. 14 in which the laser light output and the detection values of the detectors have a linear relation. The position of the bent portion may change depending on the bending angle of the waveguide, the material properties of the waveguide, and the way the light flux of the output light is used. In many cases, favorable results can be obtained when the bent portion is designed to be located within the range of 5% to 30% of the distance between the input port and the output port of the output-side waveguide.

INDUSTRIAL APPLICABILITY

The semiconductor laser module according to the present invention is suitable for use as a signal light source for optical communication, for example.

The invention claimed is:

1. A semiconductor laser module, comprising:
    a semiconductor device including
        a semiconductor laser configured to emit laser light, and
        a bending waveguide configured to propagate the laser light emitted from the semiconductor laser;
    a beam splitter configured to receive the laser light propagated through the bending waveguide and split the laser light into first laser light and second laser light;
    a plurality of detectors respectively arranged at different positions in a cross section of a light flux of the second laser light to detect the second laser light at the different positions in the same light flux; and
    a waveform shaping unit provided on an optical path of the laser light and configured to maintain a substantially linear relationship between an output of the semiconductor laser and each of detection values of the plurality of detectors, wherein
    at least a portion of the bending waveguide serves as the waveform shaping unit,
    the bending waveguide has a bending radius R satisfying
    $$R > A \times \Delta n^{(-B)},$$
    where $\Delta n$ is equivalent refractive index difference between a waveguide portion and a cladding portion of the bending waveguide defined as (refractive index of the waveguide portion-refractive index of the cladding portion)/refractive index of the waveguide portion, and A and B are constants with A=0.62 and B=1.59, and
    the bending radius R is equal to or larger than 1000 micrometers.

2. The semiconductor laser module according to claim 1, wherein the waveform shaping unit is configured to shape a far field pattern of the laser light at an output port of the semiconductor device to be approximately symmetrical with respect to an optical axis of the laser light.

3. The semiconductor laser module according to claim 2, wherein an optical output loss due to the bending waveguide is equal to or smaller than 2%.

4. The semiconductor laser module according to claim 2, wherein
    the semiconductor laser is a selective-type wavelength-tunable laser including a plurality of semiconductor laser elements,
    the laser light is a wavelength-tunable laser light output from a selected semiconductor laser element selected from the semiconductor lasers,
    the semiconductor device further includes an optical coupler configured to output the wavelength-tunable laser light to the bending waveguide, and
    the waveform shaping unit includes a leakage-light blocking portion configured to block leakage light from the optical coupler.

5. The semiconductor laser module according to claim 2, wherein
    the semiconductor device further includes a semiconductor optical amplifier configured to amplify the laser light emitted from the semiconductor laser, and
    the bending waveguide is arranged at a stage prior to an optical input stage of the semiconductor optical amplifier.

6. The semiconductor laser module according to claim 2, wherein the plurality of detectors includes
    an output detector configured to detect optical intensity of the laser light output from the semiconductor device, and
    a wavelength detector configured to detect optical intensity of a light component in a predetermined wavelength region of the laser light output from the semiconductor device.

7. The semiconductor laser module according to claim 2, wherein
    at least a portion of the bending waveguide serves as the waveform shaping unit, and
    a bent portion of the bending waveguide is set at a position in a distance of 5% to 30% of a waveguide including the bending waveguide from an input port of the waveguide.

8. The semiconductor laser module according to claim 1, further comprising:
    an optical isolator configured to receive the first laser light from the beam splitter;
    a focusing lens configured to focus the first laser light from the optical isolator; and
    a single-mode fiber to which the focused first laser light is coupled via the focusing lens.

* * * * *